United States Patent
Hong et al.

(10) Patent No.: US 9,935,013 B2
(45) Date of Patent: Apr. 3, 2018

(54) FLEXIBLE DEVICE MODULATION BY OXIDE ISOLATION STRUCTURE SELECTIVE ETCHING PROCESS

(71) Applicant: Taiwan Semiconductor Manufacturing CO., LTD., Hsinchu (TW)

(72) Inventors: Long-Jie Hong, Hsinchu (TW); Chih-Lin Wang, Zhubei (TW); Kang-Min Kuo, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 63 days.

(21) Appl. No.: 14/248,755

(22) Filed: Apr. 9, 2014

(65) Prior Publication Data

US 2015/0294914 A1    Oct. 15, 2015

(51) Int. Cl.

| H01L 21/336 | (2006.01) |
|---|---|
| H01L 21/8234 | (2006.01) |
| H01L 27/088 | (2006.01) |
| H01L 29/66 | (2006.01) |
| H01L 29/06 | (2006.01) |
| H01L 29/51 | (2006.01) |
| H01L 29/49 | (2006.01) |

(52) U.S. Cl.
CPC ......... *H01L 21/823456* (2013.01); *H01L 21/823412* (2013.01); *H01L 27/088* (2013.01); *H01L 29/0607* (2013.01); *H01L 29/66545* (2013.01); *H01L 29/66621* (2013.01); *H01L 29/49* (2013.01); *H01L 29/517* (2013.01)

(58) Field of Classification Search
CPC ........... H01L 2224/80001; H01L 2924/13091
See application file for complete search history.

(56) References Cited

U.S. PATENT DOCUMENTS

| 5,178,813 | A  * | 1/1993  | Akatsu   | D01F 6/765 |
|---|---|---|---|---|
| | | | | 264/210.7 |
| 6,566,734 | B2 * | 5/2003  | Sugihara | H01L 29/1045 |
| | | | | 257/316 |
| 8,497,212 | B2 * | 7/2013  | Babich   | H01L 21/28088 |
| | | | | 257/E21.249 |
| 8,518,813 | B2 * | 8/2013  | Yamakawa | H01L 21/823807 |
| | | | | 257/E21.159 |
| 8,691,650 | B2 * | 4/2014  | Cheng    | H01L 29/66772 |
| | | | | 257/E21.407 |
| 8,815,702 | B2 * | 8/2014  | Oh       | H01L 21/84 |
| | | | | 257/E21.442 |
| 9,196,710 | B2 * | 11/2015 | Wei      | H01L 29/6681 |

* cited by examiner

*Primary Examiner* — Zandra Smith
*Assistant Examiner* — Andre' C Stevenson

(57) ABSTRACT

A semiconductor device with an increased effective gate length or an increased effective channel width, and a method of forming the same are provided. The effective gate length or the effective channel width of the device is increased by lowering a top surface of an oxide isolation structure below the gate of the semiconductor device.

20 Claims, 10 Drawing Sheets

FLEXIBLE DEVICE MODULATION BY OXIDE ISOLATION STRUCTURE SELECTIVE ETCHING PROCESS

BACKGROUND

At present, integrated circuit (IC) chips must be able to allow a wide range of on-chip requirements across devices on the chip to increase circuit performance. However, satisfying the wide range of on-chip requirements across various devices needs to increase the design flexibility, and the process complexity is thus also increased.

For example, gate oxide thickness variation, poly gate length variation, and pocket implantation are usually used to modulate $I_{ddq}$ performance across various devices on a single IC chip. However, as the critical line width of the semiconductor process is continuously decreased, and the operation speed has to be continuously increased, the methods described above are trapped in a bottleneck.

For the method of varying the gate oxide thickness, the material of the gate oxide layer has been replaced by dielectric materials with high dielectric constants, and the thickness of the gate dielectric layer has been greatly decreased to balance the current leakage and the operation speed of a CMOS device. However, the thickness of the gate dielectric layer cannot be decreased anymore, since the thickness of the gate dielectric layer has reached a physical limit. For the method of varying poly gate length, since the variation range of the gate length is majorly limited by the design rule, and the modulation effect is thus limited. For the method of pocket implantation, the current leakage of a CMOS device can be decreased as the doping concentration of the pocket implantation is increased and the doping concentration of source/drain is decreased, but the operation speed of the devices is also sacrificed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
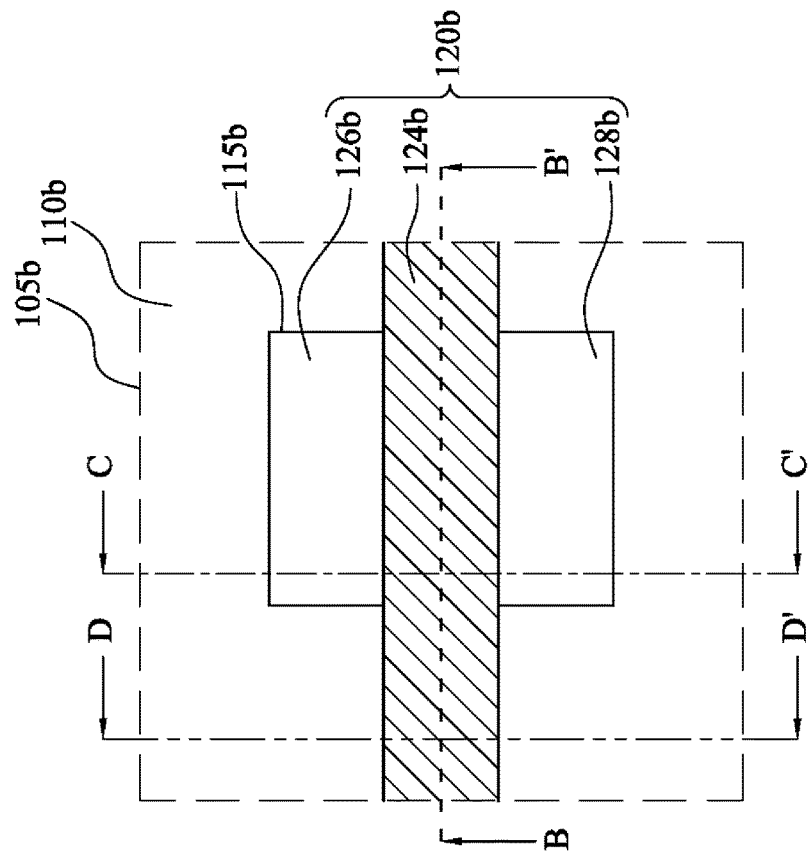
FIG. 1A is a top view diagram showing an integrated circuit structure according to some embodiments of this disclosure.
Figure 1A:
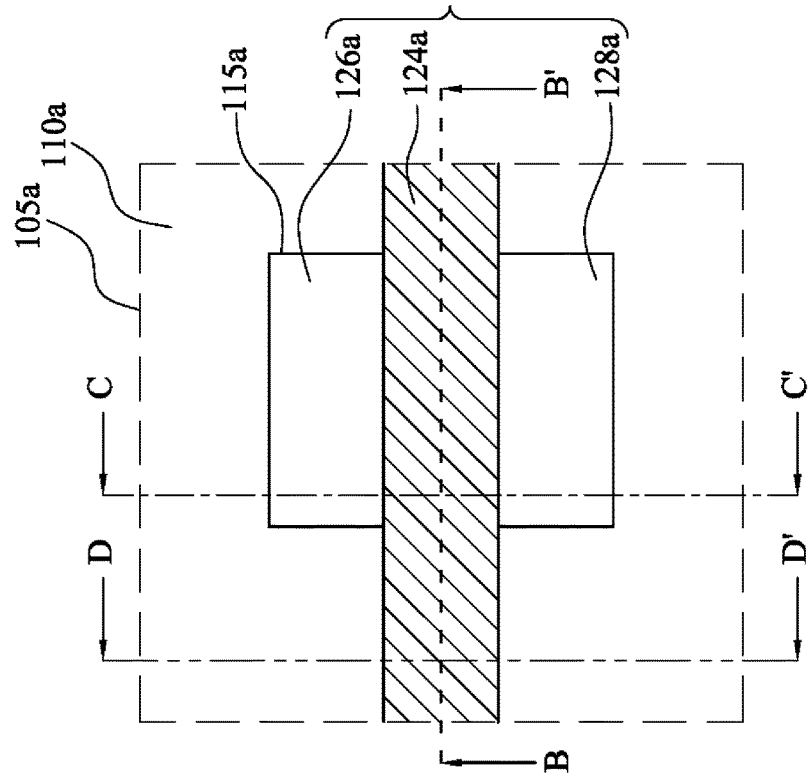

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Accordingly, a semiconductor device with an increased effective gate length or an increased effective channel width, but without increasing the occupied area of the semiconductor device, and a method of forming the same are provided in this disclosure. The effective gate length or an effective channel width of the device is increased by lowering a top surface of an oxide isolation structure below the gate of the semiconductor device.

Figure 1B:
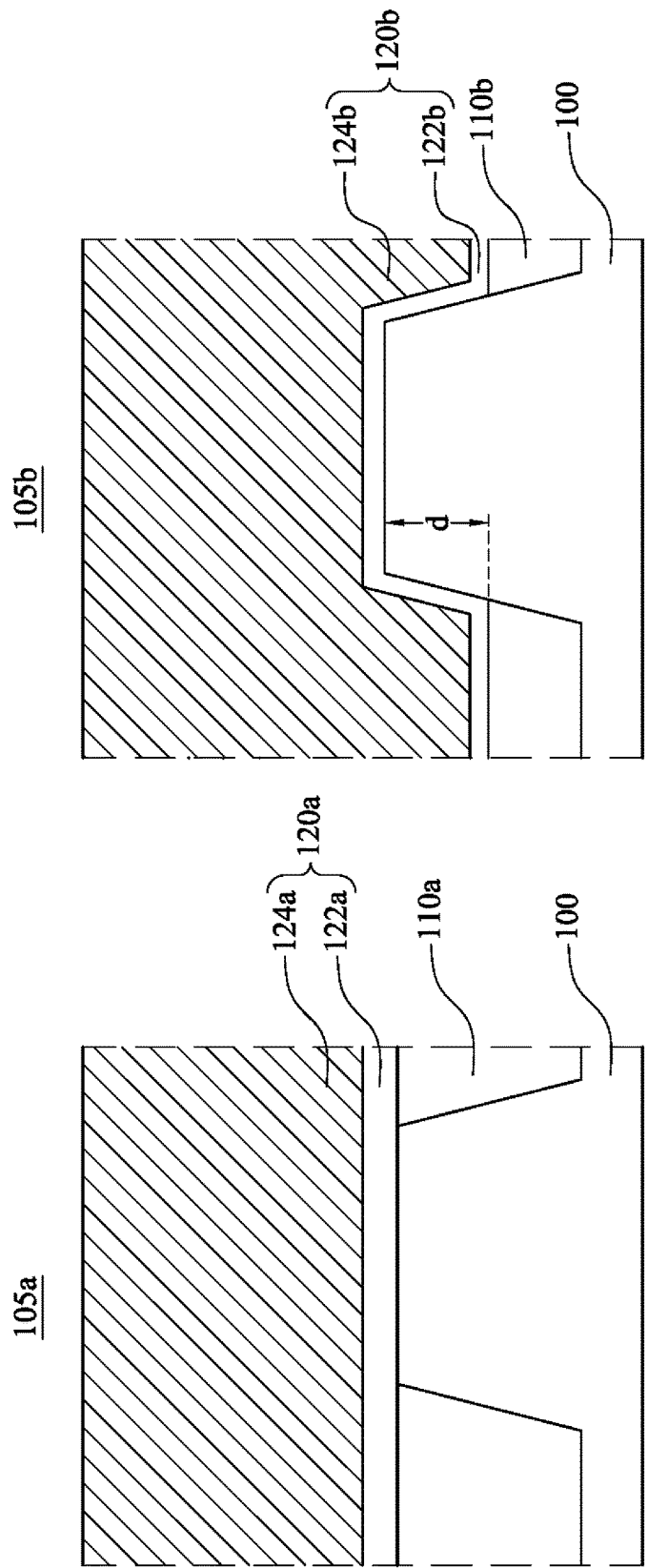
FIGS. 1B-1D are cross-sectional diagrams of cutting lines B-B', C-C', and D-D' in FIG. 1A, respectively.
Figure 1C:
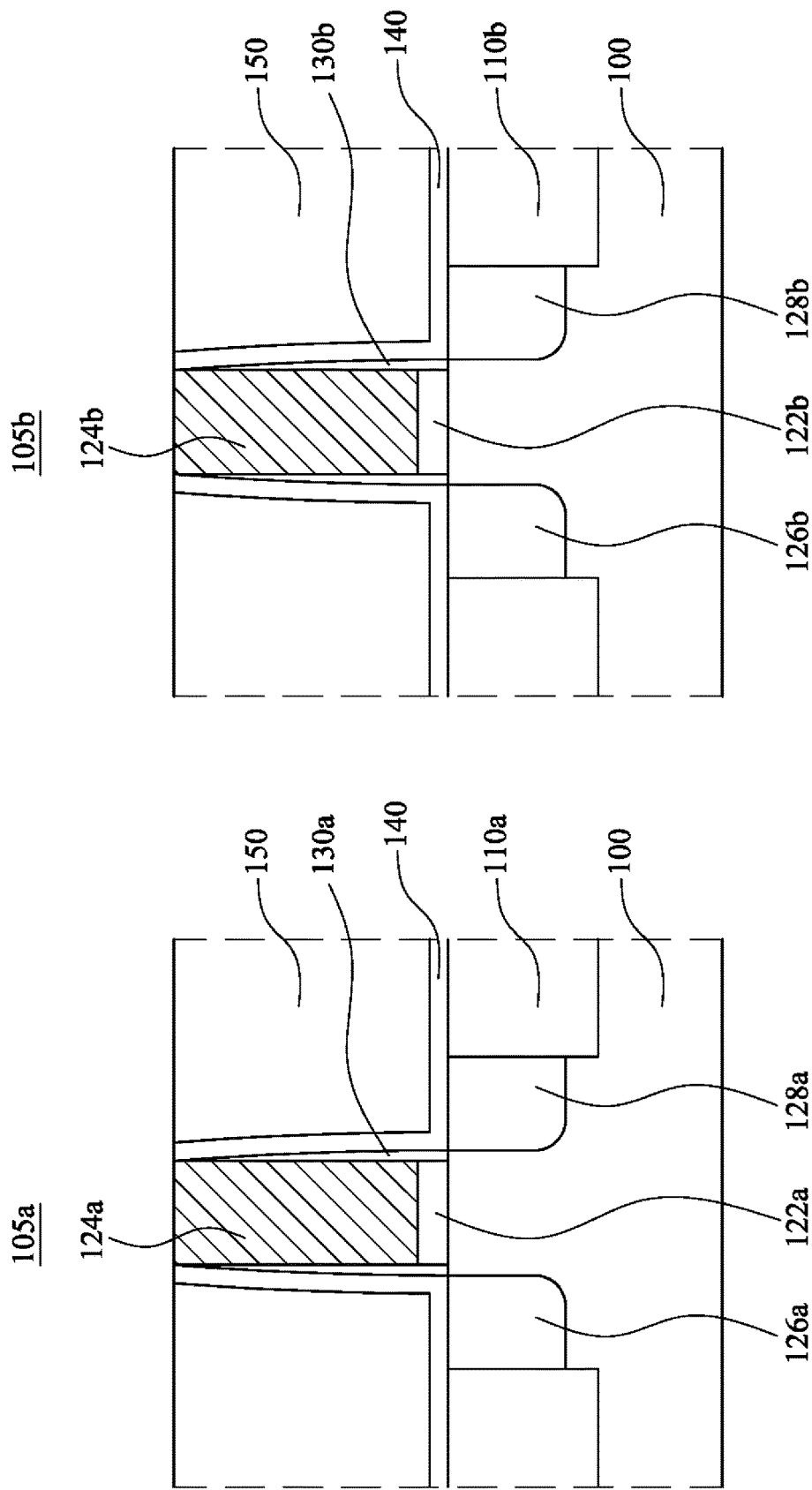
Figure 1D:
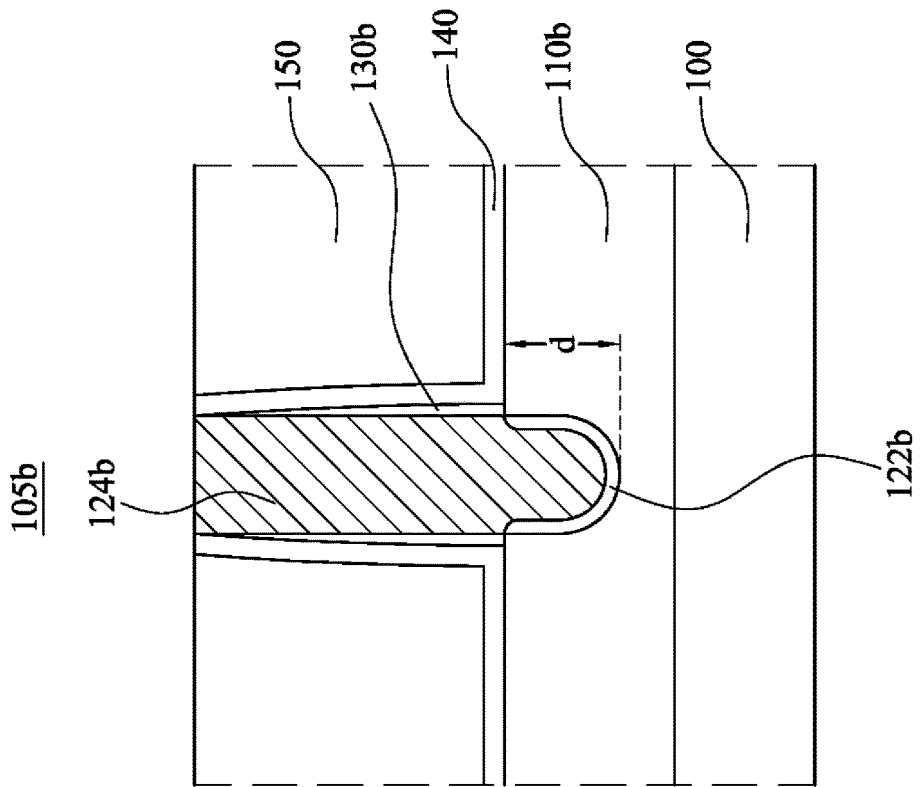
Figure 1D:
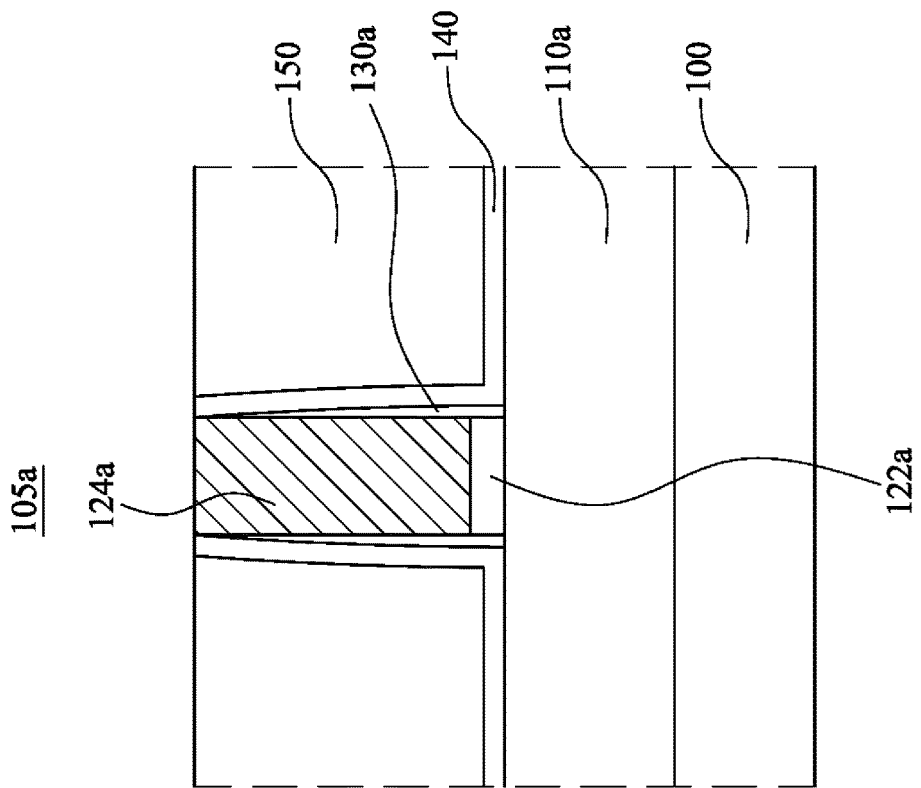

FIG. 1A is a top view diagram showing an integrated circuit structure according to some embodiments of this disclosure. FIGS. 1B-1D are cross-sectional diagrams of cutting lines B-B', C-C', and D-D' in FIG. 1A, respectively. Therefore, FIGS. 1A-1D are referred below at the same time.

In FIGS. 1A-1D, a substrate 100 has a first area 105a and a second area 105b. In some embodiments, the first area 105a and the second area 105b can be an input/output area and a logic area, for example.

In the first area 105a, a first active area 115a is surrounded or defined by a first oxide isolation structure 110a in the substrate 100. A first semiconductor device 120a is disposed on the first active area 115a. The first semiconductor device 120a includes a first gate dielectric layer 122a, a first gate 124a, a first source 126a, and a first drain 128a. In the first semiconductor device 120a, the first gate dielectric layer 122a and the first gate 124a are sequentially disposed on the substrate 100. In the first active area 115a, the first source 126a and the first drain 128a are respectively located on two sides of the first gate 124a.

In the second area 105b, a second active area 115b is surrounded or defined by a second oxide isolation structure 110b in the substrate 100. A second semiconductor device 120b is disposed on the second active area 115b. The second semiconductor device 120b includes a second gate dielectric layer 122b, a second gate 124b, a second source 126b, and a second drain 128b. In the second semiconductor device 120b, the second gate dielectric layer 122b and the second gate 124b are sequentially disposed on the substrate 100. In the second active area 115b, the second source 126b and the second drain 128b are respectively located on two sides of the second gate 124b.

In addition, the top surface of the second oxide isolation structure 110b is lowered to increase the effective gate length of the second gate 124b or increase the channel width of the channel between the second source 126b and the second drain 128b. Therefore, the top surface of the second oxide isolation structure 110b below the second gate 124b is lower than the top surfaces of the second oxide isolation structure 110b not below the second gate 124b, such as shown in FIG. 1D, and the second active area 115b, such as shown in FIG. 1B, by a depth d from about 6 nm to the depth of the second oxide isolation structure 110b. According to some embodiments, the depth d may be more than 8 nm. According to some other embodiments, the depth d may be more than 10 nm.

In some embodiments, the first oxide isolation structure 110a and the second oxide isolation structure 110b above may be shallow trench isolation structures or field oxide isolation structures, for example. In some other embodiments, the first semiconductor device 120a and the second semiconductor device 120b may be a metal-oxide-semiconductor filed effect transistor (MOSFET), for example.

In some other embodiments, the first gate dielectric layer 122a and the second gate dielectric layer 122b above may be made from a dielectric material having a dielectric constant more than the dielectric constant of silicon dioxide (i.e. a high-k dielectric material). The high-k dielectric material may be hafnium silicate, zirconium silicate, hafnium dioxide, zirconium dioxide, or any combinations thereof, for example. In some other embodiments, the first gate 124a and the second gate 124b above may be made from a metal, such as Al, W, Ta, TaN, TiN, or any combinations thereof, for example.

In addition, first spacers 130a and second spacers 130b may further respectively disposed on sidewalls of the first gate 124a and the second gate 124b. In some embodiments, the first spacers 130a and the second spacers 130b may be made from silicon oxide or silicon oxynitride, for example.

Furthermore, an etching stop layer 140 and a dielectric layer 150 may sequentially disposed on the substrate 100 to cover the first semiconductor device 120a, the second semiconductor device 120b, the first oxide isolation structure 110a, and the second oxide isolation structure 110b. In some embodiments, the etching stop layer 140 may be made from silicon oxynitride or silicon nitride, for example. In some other embodiments, the dielectric layer 150 may be made from a dielectric material having a dielectric constant smaller than the dielectric constant of silicon dioxide (i.e. a low-k dielectric material). Common low-k dielectric material includes fluorine-doped silicon dioxide, carbon-doped silicon dioxide, porous silicon dioxide, porous carbon-doped silicon dioxide, a spin-on organic polymeric dielectric (such as polyimide, polynorbornenes, benzocyclobutene, or polytetrafluoroethylene), a spin-on silicone based polymeric dielectric (such as hydrogen silsesquioxane (HSQ) and methylsilsesquioxane (MSQ)).

Figure 2:
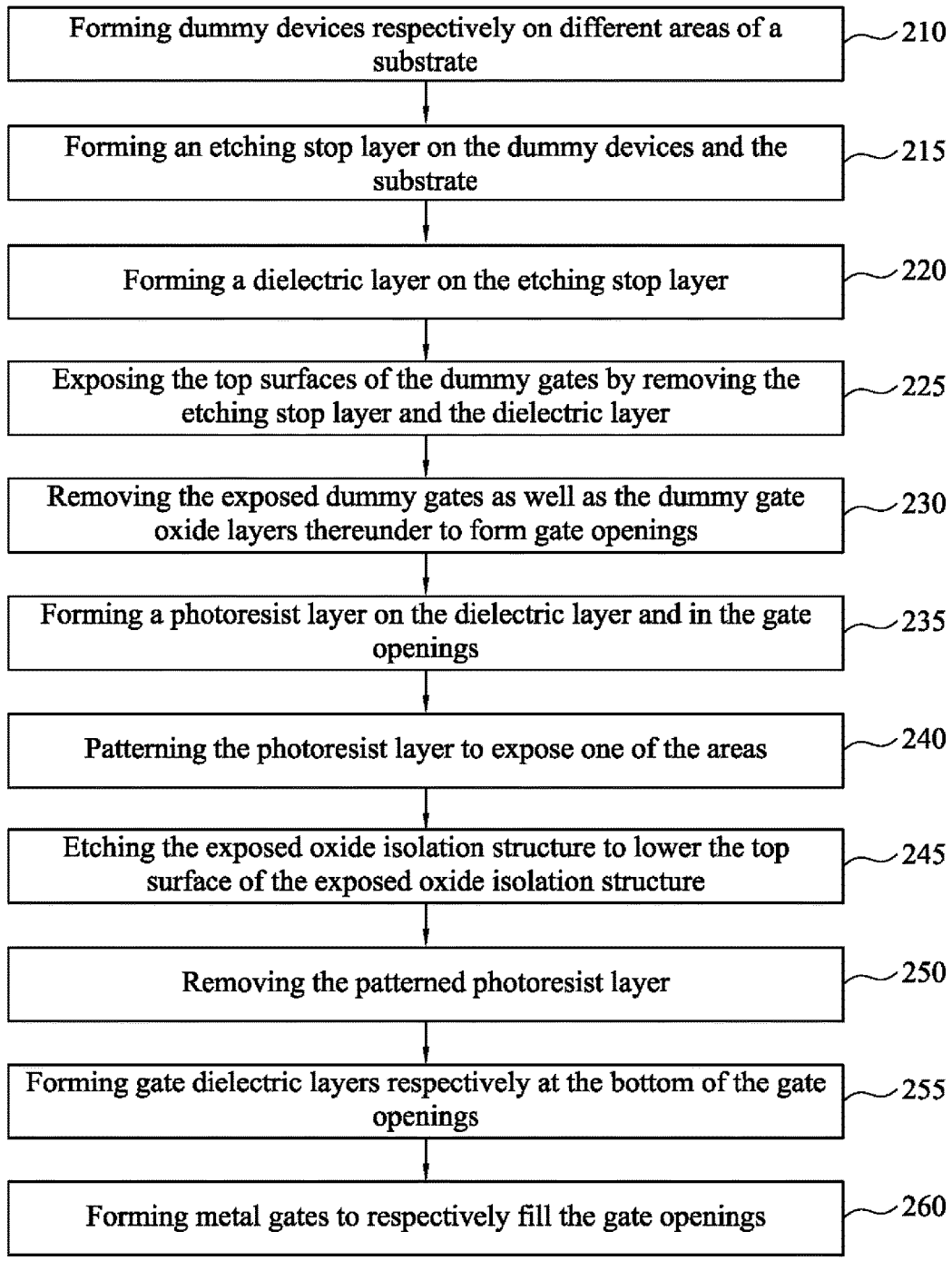
FIG. 2 is a flow chart of a process for adjusting effective gate length or effective channel width of a semiconductor device according to some embodiments of this disclosure.

Next, a method of adjusting effective gate length of a semiconductor device is discussed below. Accordingly, FIG. 2 is a flow chart of a process for adjusting effective gate length or effective channel width of a semiconductor device according to some embodiments of this disclosure. FIGS. 3A-3E are cross-sectional diagrams of cutting lines D-D' in FIG. 1A to illustrate a process for adjusting effective gate length or effective channel width of a semiconductor device according to some embodiments of this disclosure. FIGS. 2 and 3A-3E are referred below at the same time.

Figure 3A:
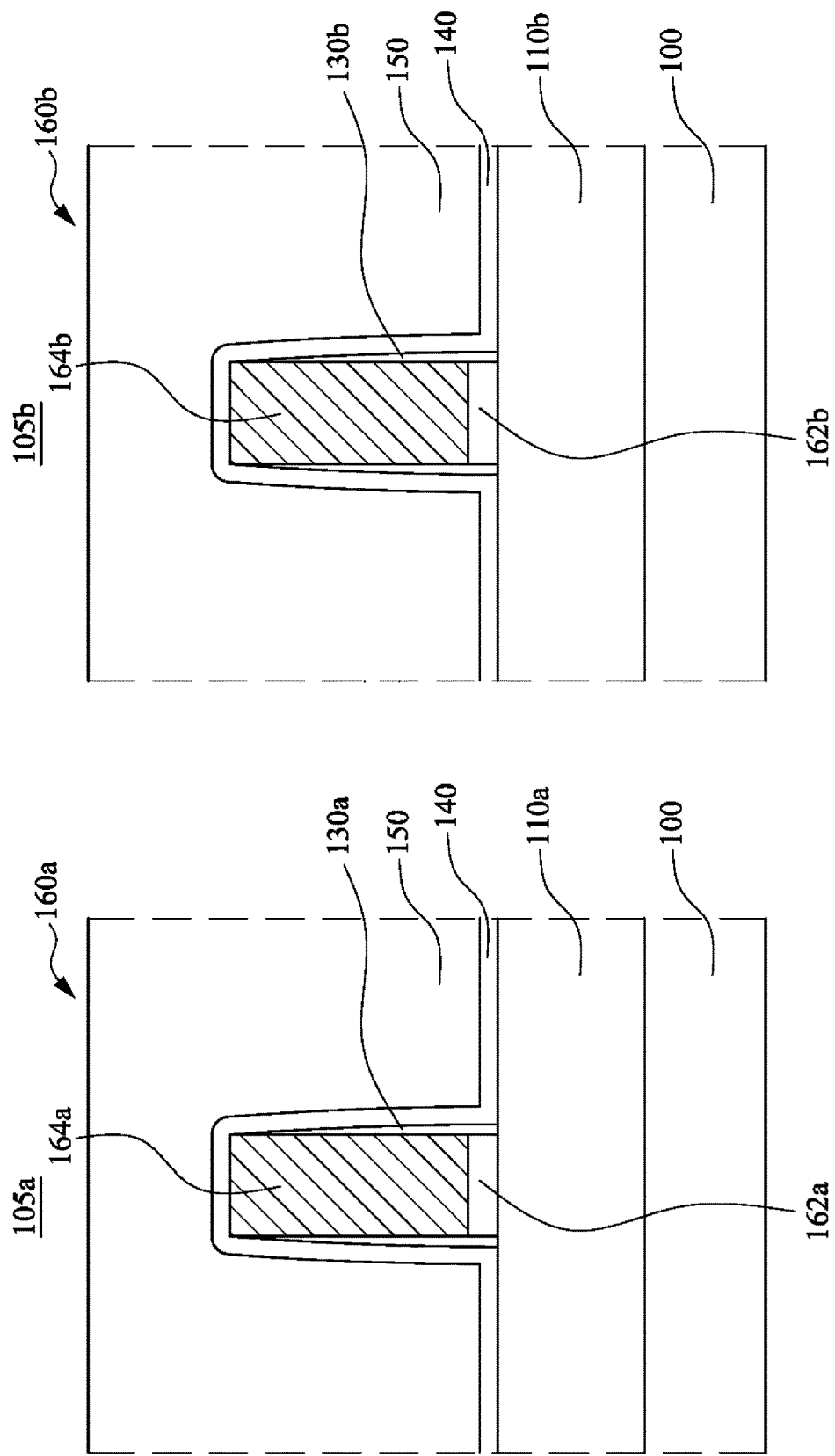
FIGS. 3A-3E are cross-sectional diagrams of cutting lines D-D' in FIG. 1A to illustrate a process for adjusting effective gate length or effective channel width of a semiconductor device according to some embodiments of this disclosure.

In step 210 of FIG. 2 and FIG. 3A, a first dummy semiconductor device 160a and a second dummy semiconductor device 160b are formed respectively in the first area 105a and the second area 105b on the substrate 100. The first dummy semiconductor device 160a includes a first dummy gate oxide layer 162a, a first dummy gate 164a, the first source 126a (see FIG. 1A) and the first drain 128a (see FIG. 1A). The second dummy semiconductor device 160b includes a second dummy gate oxide layer 162b, a second dummy gate 164b, the second source 126b (see FIG. 1A) and the second drain 128b (see FIG. 1A).

Next, the first spacers 130a and the second spacers 130b are respectively formed on the sidewalls of the first dummy gate 164a and the second dummy gate 164b. The first spacers 130a and the second spacers 130b may be formed by a process of depositing a dielectric layer followed by anisotropic etching the dielectric layer. The deposition method of the dielectric layer may be performed by a chemical vapor deposition. The anisotropic etching may be performed by plasma etching.

In step 215 of FIG. 2 and FIG. 3A, the etching stop layer 140 is formed on the substrate 100 to cover the first dummy semiconductor device 160a, the second dummy semiconductor device 160b, the first oxide isolation structure 110a and the second oxide isolation structure 110b. Then, in step 220 of FIG. 2 and FIG. 3A, the dielectric layer 150 is formed on the substrate 100 to cover the etching stop layer 140.

Figure 3B:
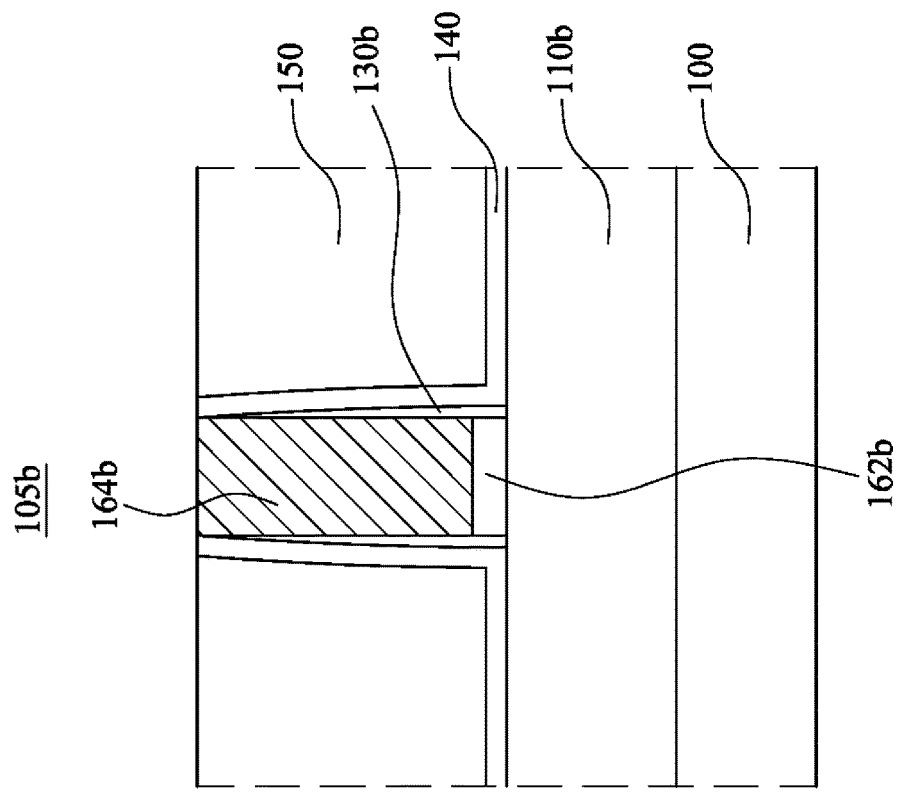
Figure 3B:
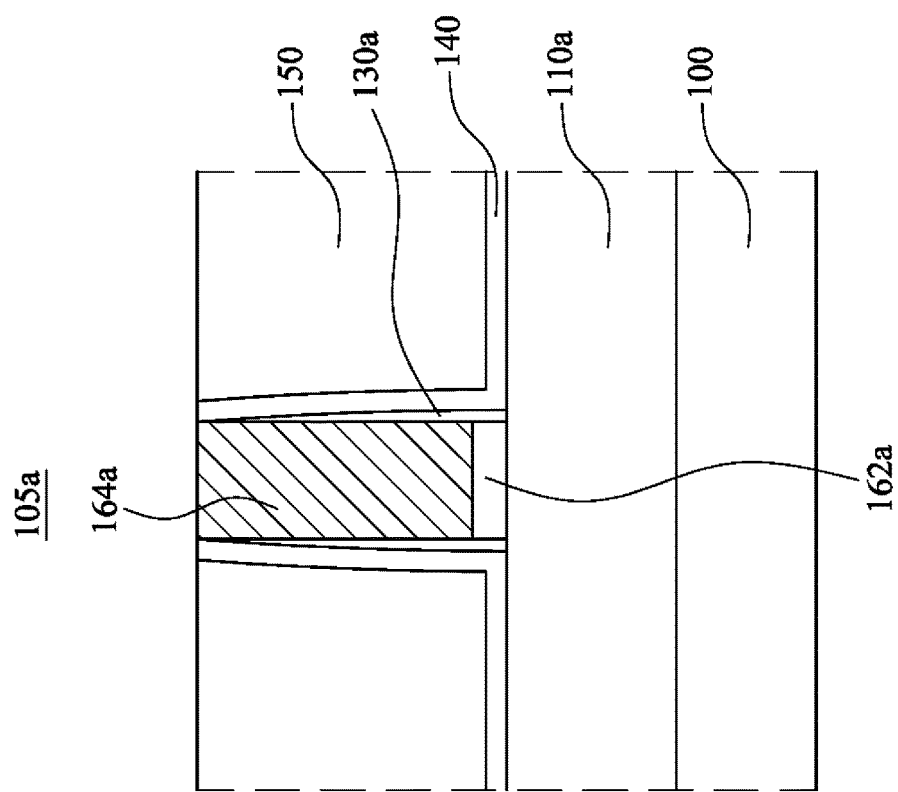

In step 225 of FIG. 2 and FIG. 3B, the top surfaces of the first dummy gate 164a and the second dummy gate 164b are exposed by removing the etching stop layer 140 and the dielectric layer 150 above the first dummy gate 164a and the second dummy gate 164b. The removal of the etching stop layer 140 and the dielectric layer 150 may be performed by blanket etching or chemical mechanical polishing.

Figure 3C:
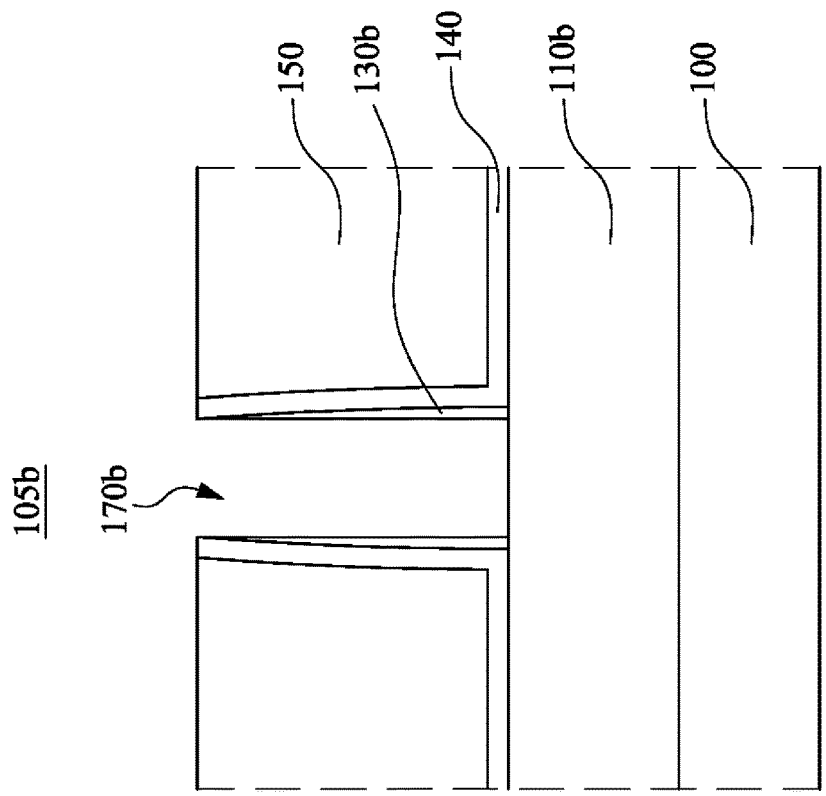

In step 230 of FIG. 2 and FIG. 3C, the first dummy gate 164a and the first dummy gate oxide layer 162a thereunder, as well as the second dummy gate 164b and the second dummy gate oxide layer 162b thereunder are removed to form the first gate opening 170a and the second gate opening 170b. The removing may be performed by any available etching process, such as dry etching or wet etching.

Figure 3D:
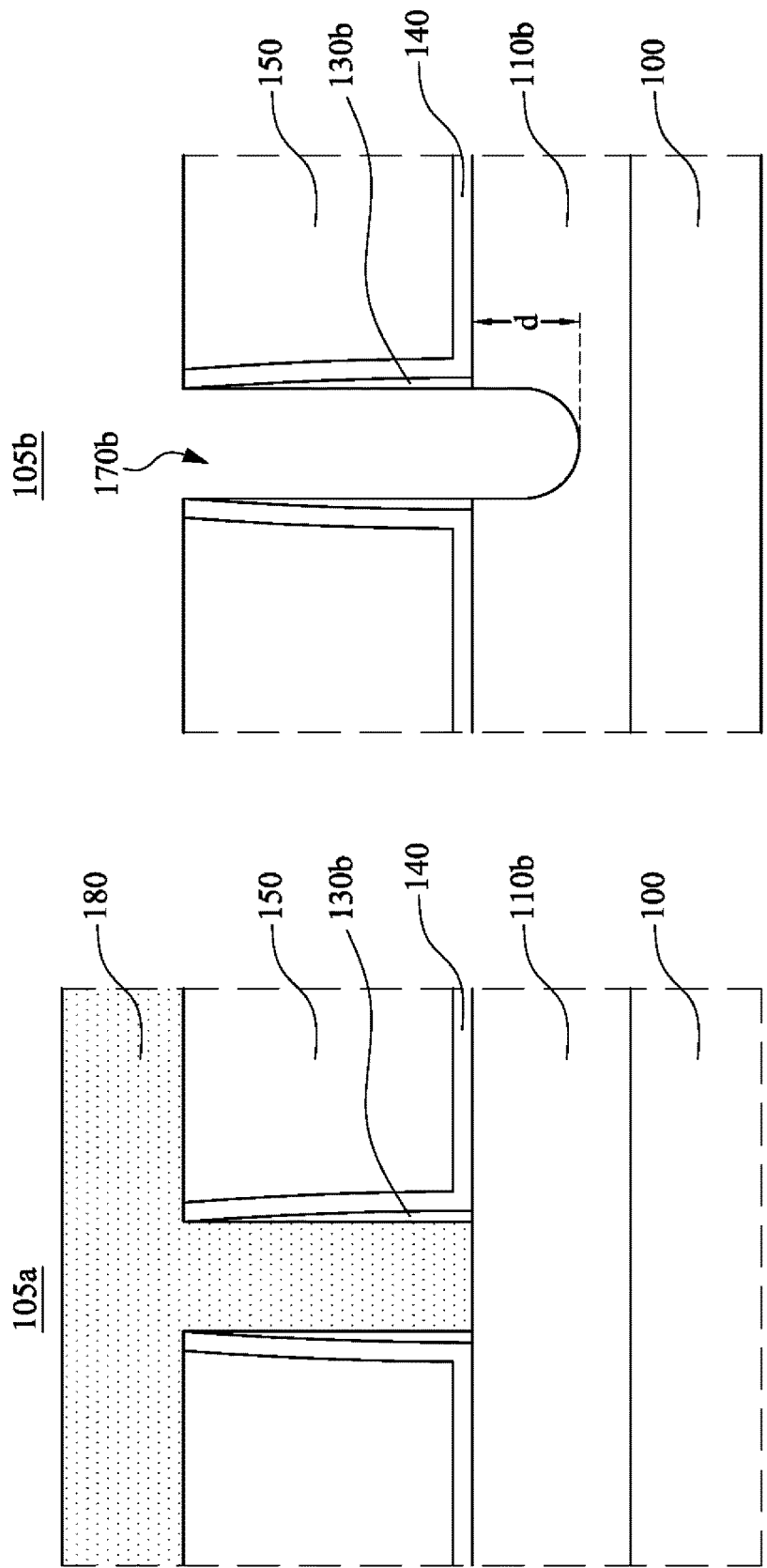

In step 235 of FIG. 2 and FIG. 3D, a photoresist layer 180 is formed on the substrate 100 to cover the first area 105a and the second area 105b, as well as to fill the first gate opening 170a and the second gate opening 170b. Then in step 240, the photoresist layer 180 is patterned to cover the first area 105a but expose the second area 105b, and the photoresist layer 180 in the second gate opening 170b is thus removed. The photoresist layer 180 may be patterned by a photolithography process including exposing through a photomask, developing by a developing solution to remove the photoresist not needed, and baking to remove the solvent of the photoresist to harden the photoresist.

In step 245 of FIG. 2 and FIG. 3D, the second oxide isolation structure 110b exposed by the second gate opening 170b is then etched to the depth d to lower the top surface of the second oxide isolation structure 110b exposed by the second gate opening 170b. Therefore, the etching depth d can be used to adjust the effective gate length or the effective channel width of the second semiconductor device 120b finally obtained. The deeper the etching depth d is, the longer the effective gate length is or the wider the effective channel width is. The etching may be performed by wet etching, for example.

In step 250 of FIG. 2, the patterned photoresist layer 180 is removed. The removing method of the patterned photoresist layer 180 may be ashing by oxygen plasma or stripping by a stripping solution.

Figure 3E:
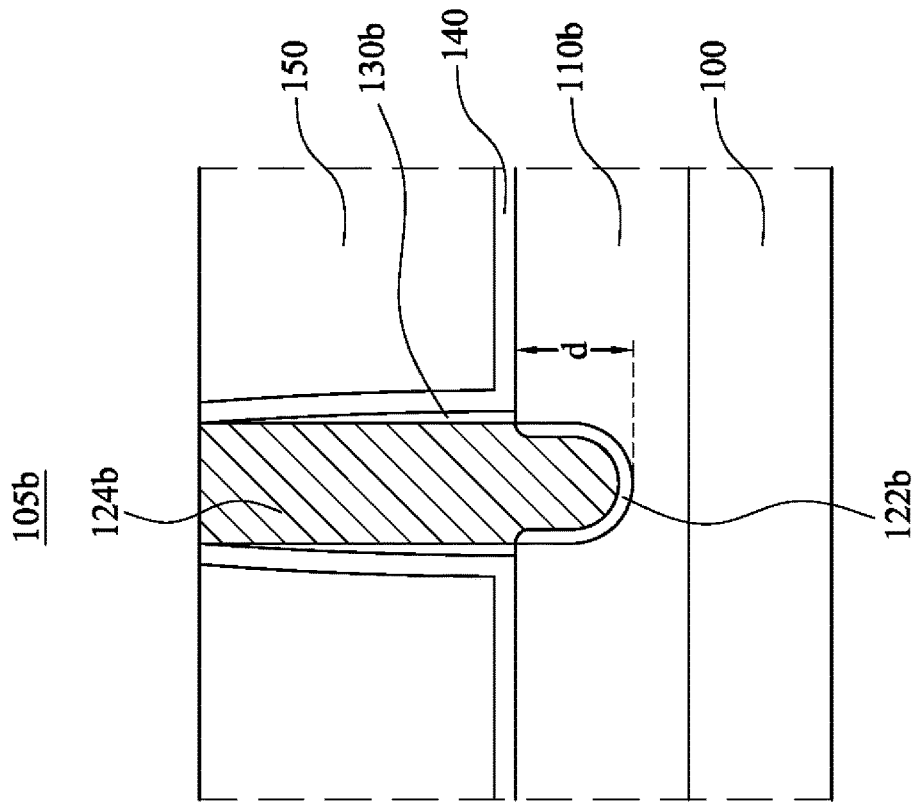
Figure 3E:
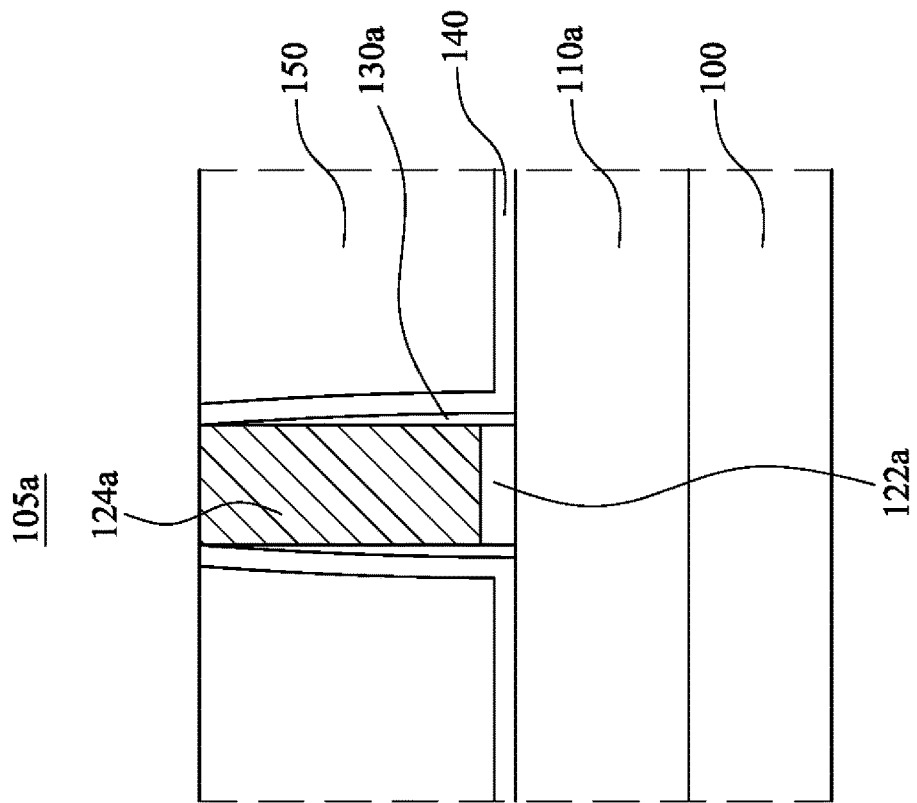

In FIG. 255 of FIG. 2 and FIG. 3E, the first gate dielectric layer 122a and the second gate dielectric layer 122b are formed respectively at the bottoms of the first gate opening 170a and the second gate opening 170b. The first gate dielectric layer 122a and the second gate dielectric layer 122b may be formed by metal organic chemical vapor deposition, or molecular beam epitaxial deposition.

In step 260 of FIG. 2 and FIG. 3E, the first gate 124a and the second gate 124b are formed respectively in the first gate opening 170a and the second gate opening 170b to fill the first gate opening 170a and the second gate opening 170b. The first gate 124a and the second gate 124b may be formed by physical vapor deposition, chemical vapor deposition, or atomic layer deposition.

Some comparison tests were performed for MOSFETs of a logic circuit in the core region of a chip. Comparing a first MOSFET obtained by a process containing no selective etch of the shallow trench isolation structure and a second MOSFET obtained by a process containing the selective etch of the shallow trench isolation structure, the top surface of the STI surrounding the second MOSFET is lowered by 6 nm. When the MOSFET is a NMOS as well as the first NMOS and the second NMOS have the same off current ($I_{off}$), the saturation drain current ($I_{dSat}$) under a constant gate voltage for the second NMOS is 5% more than the saturation drain current of the first NMOS. When the MOSFET is a PMOS as well as the first PMOS and the second PMOS have the same off current, the saturation drain current under a constant gate voltage for the second PMOS is 3% more than the saturation drain current of the first PMOS. Therefore, the on/off switch rate of the second NMOS and the second PMOS with increased gate length or increased channel width can be effectively increased to greatly improve the computing speed of the logic circuit in the core region of the chip.

Accordingly, a semiconductor device with an increased effective gate length is provided in this disclosure. The semiconductor device with an increased effective gate length comprises an active area on a substrate, an oxide isolation structure surrounding the active area, a gate across the active area and the oxide isolation structure, a gate dielectric layer disposed between the gate and the substrate, as well as a source and a drain respectively located in the exposed active area on two sides of the gate. The oxide isolation structure below the gate has a top surface lower than a top surface of the active area to increase the effective gate length.

An integrated circuit (IC) structure having devices with various effective channel widths is also provided in this disclosure. The IC structure comprises a first active area and a second active area on a substrate, a first oxide isolation structure and a second isolation structure in the substrate, a first gate across the first active area, a second gate across the second active area, a first gate dielectric layer disposed between the first gate and the substrate, a second gate dielectric layer disposed between the second gate and the substrate, a first source and a first drain respectively located in the exposed first active area on two sides of the first gate, and a second source and a second drain respectively located in the exposed second active area on two sides of the second gate. The first and the second oxide isolation structures respectively surround the first and the second active areas. The second oxide isolation structure below the second gate has a top surface lower than a top surface of the second active area.

A method of adjusting effective gate length of a semiconductor device is also provided in this disclosure. In this method, a first dummy semiconductor device and a second dummy semiconductor device are formed respectively on a first area and a second area of a substrate. An etching stop layer and a dielectric layer are sequentially formed on the first and the second semiconductor devices and the substrate. Top surfaces of a first dummy gate of the first dummy semiconductor device and a second dummy gate of the second dummy semiconductor device are exposed by removing the etching stop layer and the dielectric layer above the first dummy gate and the second dummy gate. The first dummy gate and the second dummy gate, as well as a first dummy gate oxide layer under the first dummy gate and a second dummy gate oxide layer under the second dummy gate are removed to form a first gate opening and a second gate opening. A top surface of an oxide isolation structure exposed by the second gate opening is lowered by selectively etching the oxide isolation structure exposed by the second gate opening. A first and a second gate dielectric layers are formed respectively in the first and the second gate openings. A first and a second metal gates are formed respectively on the first and the second gate dielectric layers, whereby the second gate has a longer effective gate length than the first gate has.

Therefore, the area occupied by semiconductor devices on various areas of a chip may be remained unchanged, but the effective gate length or the effective channel width can be effectively increased by selectively etching oxide isolation structures under some gates in some areas. Moreover, the increased effective gate length or the increased effective channel width can be adjusted by the etching depth d in FIG. 3D of the selectively etch. Hence, semiconductor devices with various effective gate lengths or various effective channel widths can be easily formed and integrated in one chip. Accordingly, tunable device modulation may be achieved by selectively etching oxide isolation structures, and flexible $I_{on}/I_{off}$ boost of various kinds of circuits also can be achieved to offer optimum $I_{ddq}$ and fast operation speed.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A method of adjusting effective gate length of a semiconductor device, the method comprising:
    forming a first dummy semiconductor device and a second dummy semiconductor device respectively on a first area and a second area of a substrate;
    sequentially forming an etching stop layer and a dielectric layer on the first and the second dummy semiconductor devices and the substrate;
    exposing top surfaces of a first dummy gate of the first dummy semiconductor device and a second dummy gate of the second dummy semiconductor device by removing the etching stop layer and the dielectric layer above the top surfaces of the first dummy gate and the second dummy gate;
    removing the first dummy gate and the second dummy gate, as well as a first dummy gate oxide layer under the first dummy gate and a second dummy gate oxide layer under the second dummy gate to form a first gate opening and a second gate opening;
    etching an oxide isolation structure exposed by the second gate opening to form a recess in the oxide isolation structure until a bottom of the recess of the oxide isolation structure is lower than a top surface of an active area of the substrate immediately adjacent to the recess of the oxide isolation structure;
    forming a first and a second gate dielectric layers respectively in the first and the second gate openings; and
    forming a first and a second metal gates respectively on the first and the second gate dielectric layers, whereby the second metal gate has a longer effective gate length than the first metal gate has.

2. The method of claim 1, wherein the oxide isolation structure exposed by the second gate opening is etched by a method comprising:
   forming a photoresist layer on the substrate;
   patterning the photoresist layer to expose the second area; and
   etching the oxide isolation structure exposed by the second gate opening in the exposed second area while the first area is covered by the patterned photoresist layer.

3. The method of claim 1, wherein the etching stop layer is a silicon oxynitride layer or a silicon nitride layer.

4. The method of claim 1, wherein the dielectric layer comprises a low-k dielectric layer.

5. The method of claim 1, wherein the top surfaces of the first dummy gate and the second dummy gate are exposed by performing a process of blanket etching or chemical mechanical polishing.

6. The method of claim 1, wherein the first dummy gate, the second dummy gate, the first dummy gate oxide layer, and the second dummy gate oxide layer are removed by wet etching or dry etching.

7. The method of claim 1, wherein the first and the second gate dielectric layers comprises a high-k dielectric layer.

8. The method of claim 7, wherein the high-k dielectric layer are formed by metal organic chemical vapor deposition, or molecular beam epitaxial deposition.

9. The method of claim 2, wherein patterning the photoresist layer to expose the second area is performed by a photolithography process.

10. The method of claim 9, wherein the photolithography process includes exposing through a photomask, developing by a developing solution to remove the photoresist not needed, and baking to remove the solvent of the photoresist to harden the photoresist.

11. The method of claim 2, wherein etching the oxide isolation structure is etching the oxide isolation structure to a depth from about 6 nm to a depth of the oxide isolation structure.

12. The method of claim 2, wherein the photoresist layer is removed after etching the oxide isolation structure exposed by the second gate opening in the second area.

13. The method of claim 12, wherein the photoresist layer is removed by a method of ashing by oxygen plasma or stripping by a stripping solution.

14. The method of claim 4, wherein the low-k dielectric layer comprises a material selected from a group consisting of fluorine-doped silicon dioxide, carbon-doped silicon dioxide, porous silicon dioxide, porous carbon-doped silicon dioxide, a spin-on organic polymeric dielectric, a spin-on silicone based polymeric dielectric, and a combination thereof.

15. A method of adjusting effective gate length of a semiconductor device, the method comprising:
   forming a dummy semiconductor device on a substrate;
   forming an etching stop layer on the dummy semiconductor device and the substrate;
   forming a first dielectric layer on the etching stop layer;
   removing a portion of the etching stop layer and a portion of the first dielectric layer to expose a top surface of a dummy gate of the dummy semiconductor device;
   forming a gate opening through the etching stop layer and the first dielectric layer by removing the dummy gate and a dummy gate oxide layer under the dummy gate; and
   removing a portion of an oxide isolation structure exposed by the gate opening until a top surface of the oxide isolation structure below the gate opening is lower than a top surface of the oxide isolation structure below the etching stop layer.

16. The method of claim 15, further comprising forming a spacer on sidewalls of the dummy gate during forming the dummy semiconductor device.

17. The method of claim 16, wherein forming the spacer is performed by a method comprising:
   depositing a second dielectric layer; and
   anisotropically etching the second dielectric layer.

18. The method of claim 17, further comprising forming a metal gate in the gate opening and on the top surface of the oxide isolation structure below the gate opening.

19. The method of claim 17, wherein removing the portion of the oxide isolation structure comprises etching the portion of the oxide isolation structure until the top surface of the oxide isolation structure below the gate opening is curved-shaped.

20. A method of adjusting effective gate length of a semiconductor device, the method comprising:
   forming a dummy semiconductor device on a substrate;
   forming a gate opening by removing a dummy gate of the dummy semiconductor device and dummy gate oxide layer under the dummy gate to expose an oxide isolation structure;
   removing a portion of the oxide isolation structure exposed by the gate opening to form a recess in the oxide isolation structure until a bottom of the recess of the oxide isolation structure is lower than an active area of the substrate immediately adjacent to the recess of the oxide isolation structure;
   forming a gate dielectric layer in contact with the recess of the oxide isolation structure; and
   forming a metal gate in the gate opening and on the gate dielectric layer.

* * * * *